(12) United States Patent
Sung

(10) Patent No.: US 7,141,924 B2
(45) Date of Patent: Nov. 28, 2006

(54) MULTI-LAYER CATHODE IN ORGANIC LIGHT-EMITTING DEVICES

(75) Inventor: Chao-Chin Sung, Pingtung (TW)

(73) Assignee: Au Optronics Corporation, Hsinchu (TW)

(*) Notice: Subject to any disclaimer, the term of this patent is extended or adjusted under 35 U.S.C. 154(b) by 215 days.

(21) Appl. No.: 10/842,039

(22) Filed: May 7, 2004

(65) Prior Publication Data

US 2005/0248265 A1 Nov. 10, 2005

(51) Int. Cl.
*H05B 33/00* (2006.01)
(52) U.S. Cl. .................. 313/504; 313/506; 428/917
(58) Field of Classification Search ............... 313/504, 313/506; 428/917
See application file for complete search history.

(56) References Cited

U.S. PATENT DOCUMENTS

| 6,013,384 A | 1/2000 | Kido et al. |
| 6,137,223 A * | 10/2000 | Hung et al. ............... 313/506 |
| 6,579,629 B1 | 6/2003 | Raychaudhuri et al. |
| 6,803,123 B1 * | 10/2004 | Wang et al. ................ 428/690 |
| 6,992,438 B1 * | 1/2006 | Burroughes et al. ........ 313/506 |
| 2002/0027416 A1 * | 3/2002 | Kim et al. ................... 313/506 |
| 2002/0036297 A1 * | 3/2002 | Pichler ....................... 257/103 |
| 2002/0101154 A1 * | 8/2002 | Seo et al. ................... 313/506 |
| 2003/0038593 A1 * | 2/2003 | Aziz et al. .................. 313/506 |
| 2003/0102801 A1 * | 6/2003 | Senbonmatsu .............. 313/506 |
| 2004/0155579 A1 * | 8/2004 | Hsiao ......................... 313/506 |
| 2005/0248267 A1 * | 11/2005 | Gyoutoku et al. .......... 313/506 |

* cited by examiner

*Primary Examiner*—Ashok Patel
(74) *Attorney, Agent, or Firm*—Duane Morris LLP

(57) ABSTRACT

An organic light-emitting device includes a substrate, an anode disposed over the substrate, at least one organic light-emitting layer disposed over the anode, a buffer layer disposed over the organic light emitting layer, and a cathode disposed over the buffer layer. The cathode layer includes a first cathode layer, a second cathode layer, and a third cathode layer. The first cathode layer includes conductive material. The second cathode layer includes electron transport material. The third cathode layer includes conductive material.

18 Claims, 5 Drawing Sheets

MULTI-LAYER CATHODE IN ORGANIC LIGHT-EMITTING DEVICES

FIELD OF THE INVENTION

The present invention relates to organic light-emitting devices, and more particularly to a multi-layer cathode structure in organic light-emitting devices, as well as a method of manufacturing such devices.

BACKGROUND

Organic light-emitting devices, for example organic light emitting diodes (OLEDs), are broadly researched for their application in flat-panel displays. Unlike liquid crystal displays, flat-panel displays employing organic light-emitting devices are brighter, because organic light-emitting devices can emit light themselves and do not need backlight systems. In addition, with different organic materials, organic light-emitting devices can emit light in red, green, and blue colors with high luminance efficiency. Moreover, organic light-emitting devices can operate with low driving voltages and are viewable from oblique angles.

Organic light-emitting devices are usually structured to have several layers, including at least a layer of organic light-emitting material sandwiched between an anode and a cathode. The basic principle of operation for an organic light-emitting device is that, when a voltage is applied between the anode and cathode, electrons and holes are driven to move to the layer containing organic light-emitting material. Electrons and holes meet and emit light.

U.S. Pat. Nos. 6,137,223, 6,579,629, and 6,013,384 are expressly incorporated by reference herein in their entireties, for their teachings on OLEDs. The anode is typically made of light transmitting material such as indium tin oxide (ITO) and the cathode is made of metal. After the deposition of the organic light-emitting layer, the cathode is formed above the organic light-emitting layer. Among methods to deposit the cathode, thermal evaporation and electron beam deposition are preferred because they do not damage the organic light-emitting layer. However, these processes are very inefficient. On the other hand, sputtering has many advantages such as short cycle time, adherent coating, and economical use of deposition materials, although it can significantly damage the electrical characteristics of the organic light-emitting layer. A structure is desired for organic light-emitting devices having a cathode that can be deposited by sputtering without substantial damage to the organic light-emitting layer.

SUMMARY OF THE INVENTION

An organic light-emitting device comprises: a substrate, an anode disposed over the substrate, at least one organic light-emitting layer disposed over the anode, a buffer layer disposed over the organic light emitting layer, and a cathode disposed over the buffer layer. The cathode layer comprises: a first cathode layer, a second cathode layer, and a third cathode layer. The first cathode layer comprises conductive material. The second cathode layer comprises electron transport material. The third cathode layer comprises conductive material.

BRIEF DESCRIPTION OF THE DRAWINGS

A more complete understanding of the present invention can be obtained by reference to the detailed description of embodiments in conjunction with the accompanying drawings, in which.

DETAILED DESCRIPTION

Figure 1:
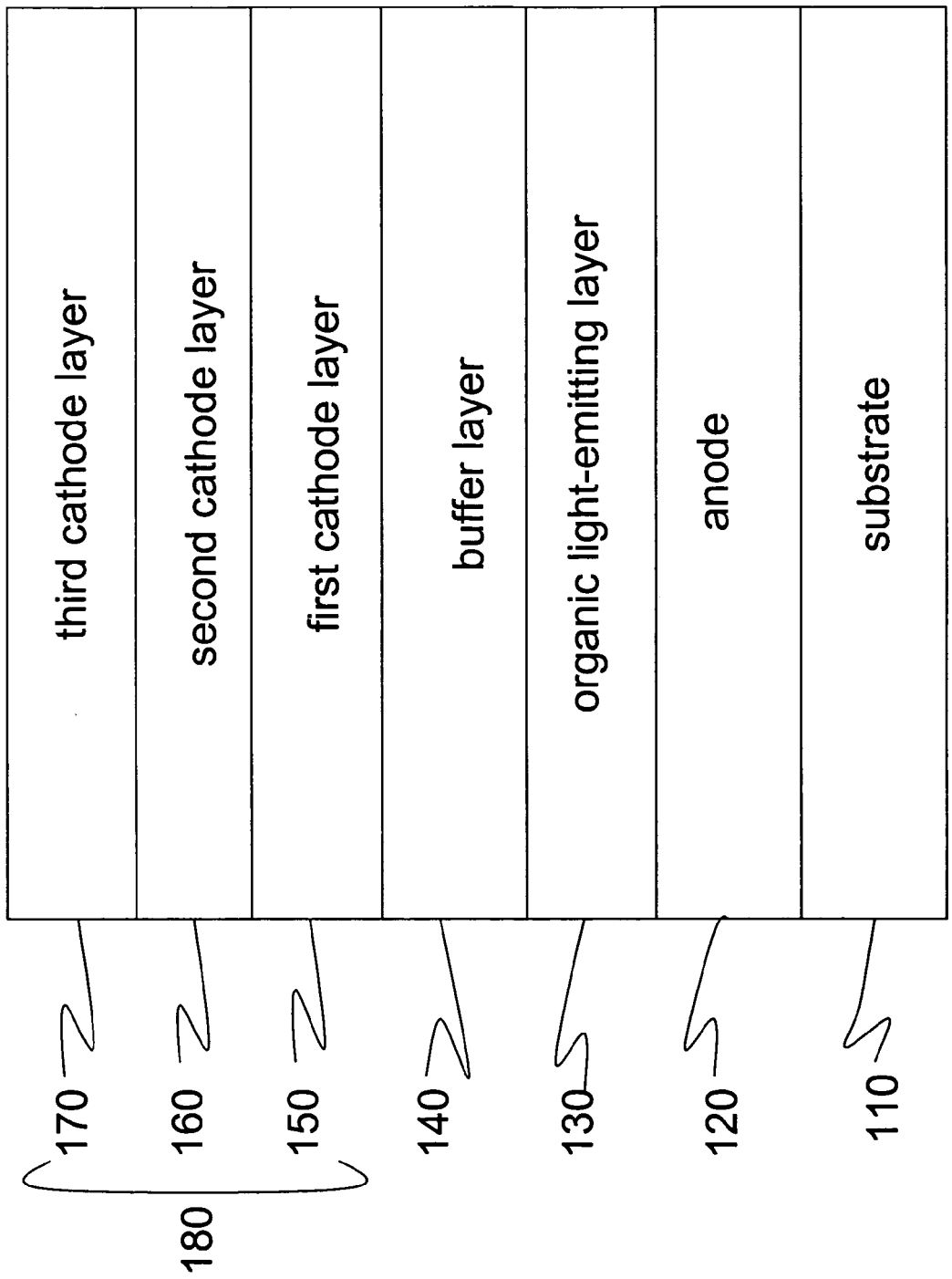
FIG. 1 illustrates a schematic view of an exemplary embodiment of an organic light-emitting device.

As shown in FIG. 1, an exemplary embodiment of an organic light-emitting device comprises a substrate 110, an anode 120, an organic light-emitting layer 130, a buffer layer 140, a cathode 180 containing a first cathode layer 150, a second cathode layer 160, and a third cathode layer 170.

The substrate 110 can comprise glass, quartz, or a light transmitting polymer such as plastic. The anode 120 disposed over the substrate 110 comprises light transmitting material such as indium tin oxide (ITO). The organic light-emitting layer 130 disposed over the anode 120 comprises at least one light-emitting doped material. The light-emitting doped material can be red, green, or blue light-emitting doped material. The red light-emitting doped material may comprise DCJTB. The green light-emitting doped material may comprise C545T. The blue light-emitting doped material may comprise TBP. One of ordinary skill in the art will understand that two or more organic light-emitting layers may be disposed over the anode 120. The buffer layer 140 disposed over the organic light-emitting layer 130 may comprise metal alkaline halide such as LiF, CsF, CsI, KI, and NaCl.

The cathode 180 disposed over the buffer layer 140 includes the first cathode layer 150, the second cathode layer 160, and the third cathode layer 170. The first cathode layer disposed over the buffer layer 140 comprises metal. For example, aluminum, magnesium, or calcium can be used to form the first cathode layer 150. The first cathode layer 150 has a thickness greater than zero and not exceeding about 600 angstroms. It is preferred that the thickness of the first cathode layer 150 ranges from about 50 to about 600 angstroms. The first cathode layer 150 can be formed by physical vapor deposition (PVD), such as thermal evaporation or e-beam (e-gun) deposition.

Due to the first cathode layer 150, the electrical characteristic and efficiency of the device is improved by increasing electrons injected into the organic light-emitting layer 130. In addition, the first cathode layer 150 can substantially prevent the organic light-emitting layer 130 from being damaged by ion bombardment in the course of depositing the third cathode layer 160. As a result, the third cathode layer 160 can be deposited by, for example, sputtering at a faster rate than a single layer cathode. Moreover, the first cathode layer 150 reflects light emitted from the organic light-emitting layer 130 to avoid the possible absorption by the second cathode layer 160, which may reduce the brightness of the device.

The second cathode layer 160 preferably comprises at least one high conjugation organic material having more than 15 π bonds such as phthalocyanine (Pc), triarylamine, polyaryl, C60, and poly(p-phenylene vinylene) (PPV). The phalocyanine comprises metal phalocyanine, such as cooper phalocyanine. The triarylamine comprises N,N-bis(carbazolyl)-4,4'-biphenyl (CBP) and N,N'-bis(1-naphthyl)-N,N'-diphenyl-1,1'-bipheny-4,4'diamine (NPB). The polyaryl comprises tert-butyl perylene (TBADN). In one embodiment, the metal phthalocyanine such as copper phthalocyanine can be used to form the second cathode layer 160. The third cathode layer 170 preferably comprises an alkaline metal alloy such as a lithium containing alloy, wherein the proportion of the alkaline metal ranges from approximately 0.1% to approximately 10%. The third cathode layer 170 may be formed by sputtering. Because of the protection provided by the first cathode layer 150, the third cathode layer can be deposited by sputtering at a rate faster than 10 angstroms per second without damaging the organic light-emitting layer 130.

Figure 2:
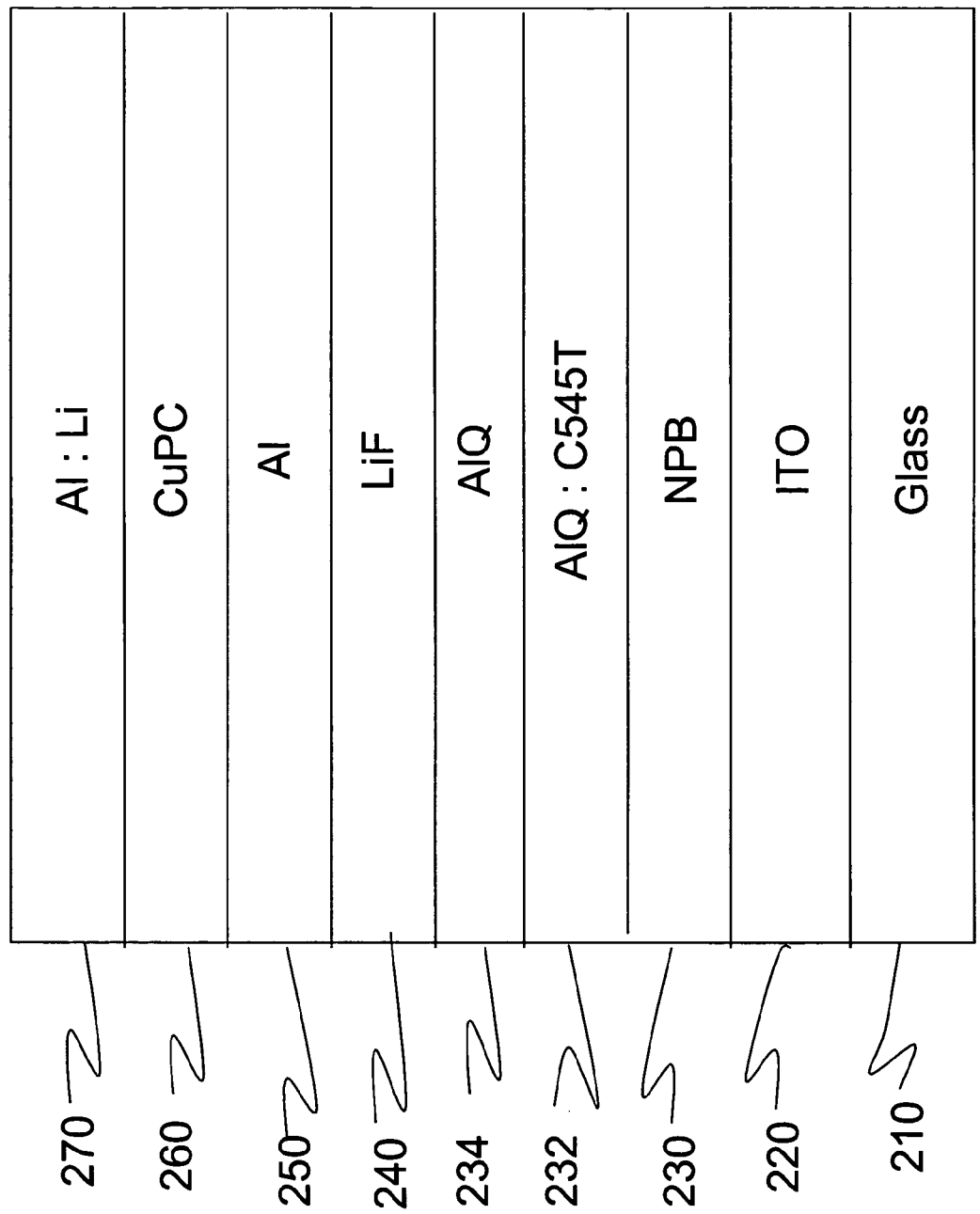
FIG. 2 illustrates a schematic view of another embodiment of an organic light-emitting device.

In one embodiment of an organic light-emitting device 200 as shown in FIG. 2, a substrate 210 comprises glass. An anode 220 comprises ITO with a thickness of approximately 600 angstroms. A first organic light-emitting layer 230 comprises NPB (4,4-bis[N-(1-naphthyl)-N-pheny-amino]biphenyl), with a thickness of approximately 200 angstroms. A second organic light-emitting layer 232 comprises AlQ3 (tris-(8-hydroxyqunoline)aluminum):C545T(10-(2-benzothiazolyl)-1,1,7,7-tetramethyl-2,3,6,7-tertrahydro-1H, 5H,11H-[1]benzo-pyran[6,7,8-ij]quinolizin-11-one) with a thickness of approximately 300 angstroms. A third organic light-emitting layer 234 comprises AlQ with a thickness of approximately 400 angstroms. A buffer layer 240 comprises LiF with a thickness of approximately 10 angstroms. A first cathode layer 250 comprises Al with a thickness of approximately 200 angstroms. A second cathode layer 260 comprises CuPc with a thickness of approximately 200 angstroms. A third cathode layer 270 comprises LiAl with a thickness of approximately 1000 angstroms.

Figure 3:
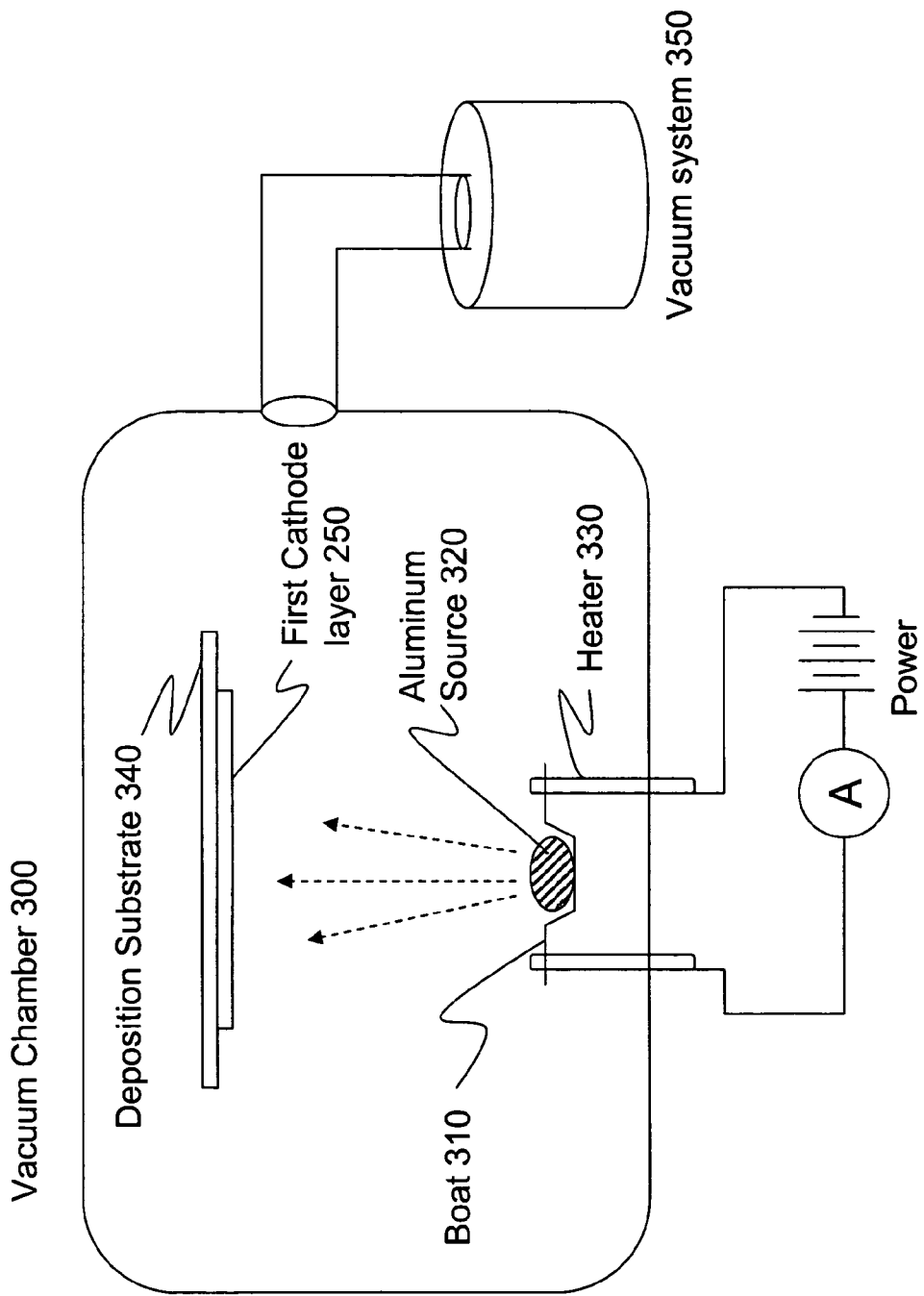
FIG. 3 illustrates a schematic view of a thermal evaporation system used to deposit a first cathode layer of an organic light-emitting device.

As shown in FIG. 3, the first cathode layer 250 is formed by vapor deposition in a vacuum chamber 300. An aluminum tablet 320 is placed on a tungsten boat 310 in the vacuum chamber 300. A deposition substrate 340, on which the LiF buffer layer 240 is formed, is disposed opposite the aluminum tablet 320. A vacuum system is employed to obtain a pressure at about $2.4 \times 10^{-6}$ Pa inside the vacuum chamber 300. When the tungsten boat 310 is heated by a heater 330 to the sublimation temperature of aluminum, which is about 660° C. at the pressure of about $2.4 \times 10^{-6}$ Pa, the aluminum is vaporized and deposited onto the deposition substrate 340 to form the first cathode layer 250.

Figure 4:
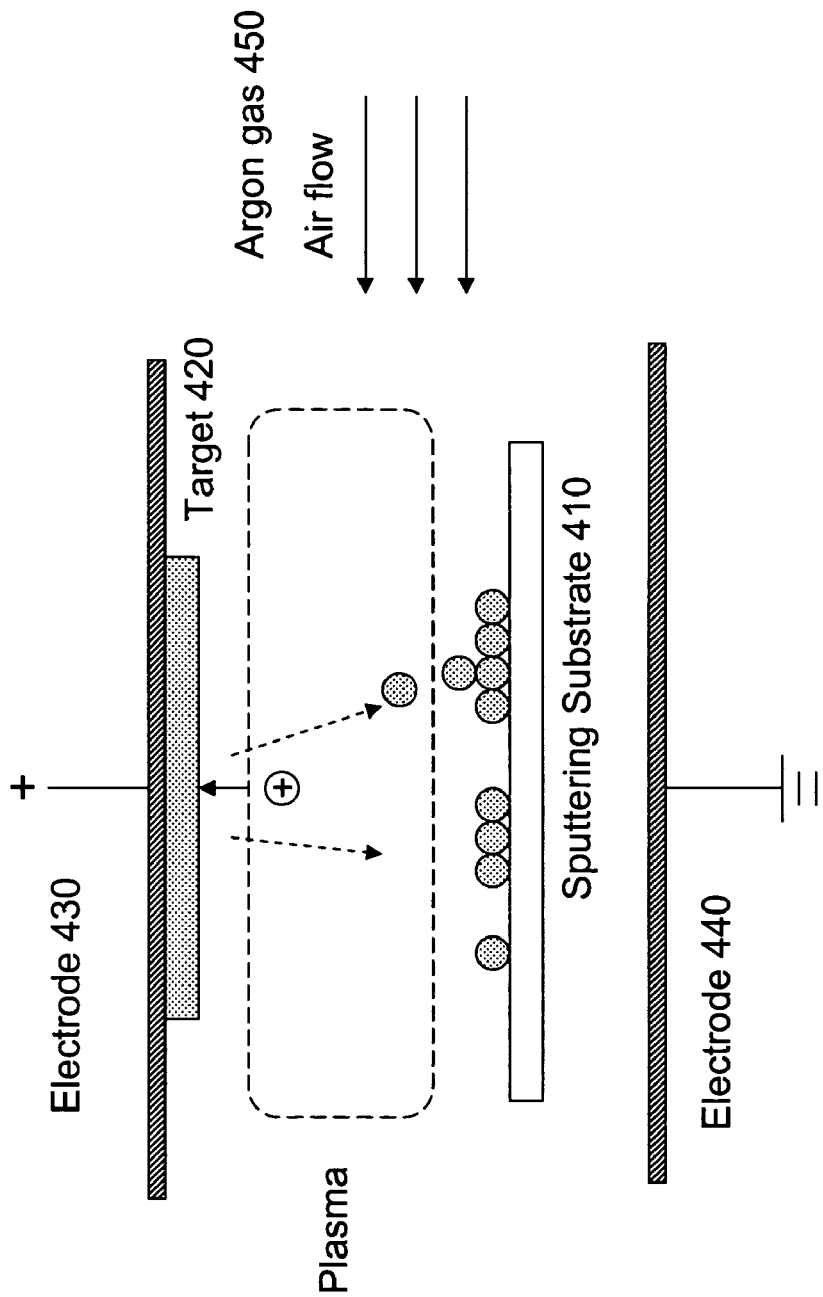
FIG. 4 illustrates a schematic view of a sputtering system used to deposit a third cathode layer of an organic light-emitting device.

In FIG. 4, the third cathode layer 270 is formed by sputtering. A target 420 of Al:Li is disposed adjacent to electrode 430. A sputtering substrate 410, on which the second cathode layer 260 is formed, is disposed opposite to the target 320 and moved at a speed of about 50 mm/min. A flow rate of Argon gas 450 is set to about 50 sccm/sec. The power for DC sputtering is about 200 W. As a result, the third cathode layer 270 is formed at a rate of about 62.5 angstrom/min.

Because of the first cathode layer 250, the organic electro-emitting device 200 has a better efficiency, current density, and brightness compared with a conventional organic electro-emitting device. For example, when the difference between the voltages applied to the anode 220 and the third cathode layer 270 is 7V, the efficiency is increased to 10.4 cd/A from 7.6 cd/A, the current density is increased to 130 mA/cm$^2$ from 85 mA/cm$^2$, and the brightness is increased to 14000 cd/M$^2$ from 6200 cd/M$^2$. There is at least a 30% improvement in each of these electrical characteristics.

Figure 5:
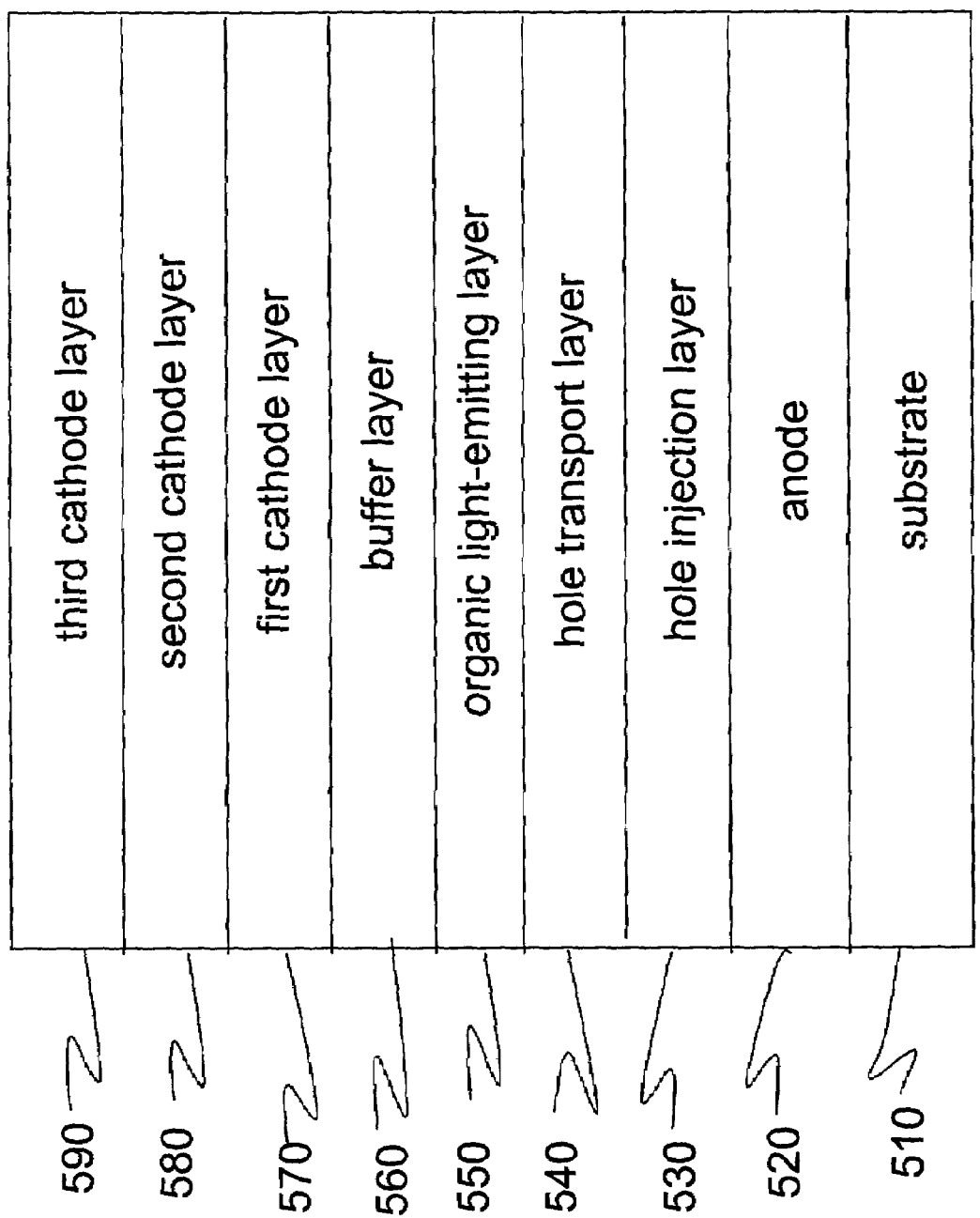
FIG. 5 illustrates a schematic view of another embodiment of an organic light-emitting device containing a hole injection layer and a hole transport layer.

FIG. 5 demonstrates another embodiment of an organic light-emitting device 500 which comprises: a substrate 510, an anode 520, a hole injection layer 530, a hole transport layer 540, an organic light-emitting layer 550, a buffer layer 560, a first cathode layer 570, a second cathode layer 580, and a third cathode layer 590. The hole injection layer 530 can comprise phthalocyanine such as CuPc (Copper phthalocyanine), which enhances the number of holes injected from the anode 520 and flowing toward the organic light-emitting layer 550. The hole injection layer 530 is deposited by CuPc with a thickness of about 200 angstroms in this embodiment. The hole transport layer 540 can comprise NPB, which facilitates the transportation of holes injected from the anode 520 and the hole injection layer 530 to the organic light-emitting layer 550. The hole transport layer 530 may be deposited by thermal evaporation with a thickness of about 200 angstroms in this embodiment.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An organic light-emitting device, comprising:
   a substrate;
   an anode disposed over the substrate;
   at least one organic light-emitting layer disposed over the anode;
   a buffer layer disposed over the organic light emitting layer;
   a cathode disposed over the buffer layer, comprising a first cathode layer, a second cathode layer, and a third cathode layer, the first cathode layer comprising conductive material, the second cathode layer comprising electron transport material, and the third cathode layer comprising conductive material.

2. The organic light-emitLing device of claim 1, wherein the first cathode layer comprises metal.

3. The organic light-emitting device of claim 1, wherein the first cathode layer comprises aluminum, magnesium, or calcium.

4. The organic light-emitting device of claim 1, wherein the first cathode layer has a thickness greater than zero and not exceeding about 600 angstroms.

5. The organic light-emitting device of claim 4, wherein the first cathode layer has a thickness ranging from about 50 to about 600 angstroms.

6. The organic light-emitting device of claim 1, wherein the first cathode layer is formed by physical vapor deposition.

7. The organic light-emitting device of claim 6, wherein the first cathode layer is formed by thermal evaporation or e-beam deposition.

8. The organic light-emitting device of claim 1, wherein the second cathode layer comprises at least one high conjugation organic material having more than 15 π bonds.

9. The organic light-emitting device of claim 8, wherein the high conjugation organic material comprises phthalocyanine, triarylamine, polyaryl, C60, and PPV.

10. The organic light-emitting device of claim 9, wherein the phthalocyanine comprises copper phthalocyanine.

11. The organic light-emitting device of claim 1, wherein the third cathode layer comprises an alkaline metal alloy.

12. The organic light-emitting device of claim 11, wherein a proportion of the alkaline metal ranges from approximately 0.1% to approximately 10% of the alkaline metal alloy.

13. The organic light-emitting device of claim 11, wherein the third cathode layer comprises lithium containing alloy.

14. The organic light-emitting device of claim 11, wherein the third cathode layer is formed by sputtering.

15. The organic light-emitting device of claim 13, wherein the third cathode layer is formed by sputtering at a rate faster than 10 angstroms per second.

16. The organic light-emitting device of claim 1, wherein the first cathode layer comprises metal, the second cathode layer comprises phthalocyanine, and the third cathode layer comprises an alkaline metal alloy.

17. The organic light-emitting device of claim 1, wherein the buffer layer comprises alkaline halide.

18. The organic light-emitting device of claim 1, further comprising:
   a hole injection layer disposed over the anode;
   a hole transport layer disposed over the hole injection layer; and
   wherein the organic light-emitting layer is disposed over the hole transport layer.

* * * * *

UNITED STATES PATENT AND TRADEMARK OFFICE
CERTIFICATE OF CORRECTION

| | | |
|---|---|---|
| PATENT NO. | : 7,141,924 B2 | Page 1 of 1 |
| APPLICATION NO. | : 10/842039 | |
| DATED | : November 28, 2006 | |
| INVENTOR(S) | : Chao-Chin Sung | |

It is certified that error appears in the above-identified patent and that said Letters Patent is hereby corrected as shown below:

Column 4, line 45 in Claim 2, replace "light-emitLing" with --light-emitting--

Signed and Sealed this

Twenty-eighth Day of August, 2007

JON W. DUDAS
*Director of the United States Patent and Trademark Office*